(12) United States Patent
Ooba et al.

(10) Patent No.: US 7,776,751 B2
(45) Date of Patent: Aug. 17, 2010

(54) PROCESS FOR PRODUCING SILICON COMPOUND

(75) Inventors: Yoshiyuki Ooba, Yokohama (JP); Hitoshi Sakamoto, Yokohama (JP)

(73) Assignee: Canon Anelva Corporation, Kanagawa (JP)

( * ) Notice: Subject to any disclaimer, the term of this patent is extended or adjusted under 35 U.S.C. 154(b) by 405 days.

(21) Appl. No.: 11/919,484

(22) PCT Filed: May 17, 2006

(86) PCT No.: PCT/JP2006/309794

§ 371 (c)(1),
(2), (4) Date: Oct. 29, 2007

(87) PCT Pub. No.: WO2006/123673

PCT Pub. Date: Nov. 23, 2006

(65) Prior Publication Data
US 2009/0081869 A1 Mar. 26, 2009

(30) Foreign Application Priority Data
May 17, 2005 (JP) .............................. 2005-144616

(51) Int. Cl.
*H01L 21/302* (2006.01)
*H01L 21/461* (2006.01)
(52) U.S. Cl. ............. 438/715; 427/255.27; 427/255.28; 216/67; 438/710; 438/689
(58) Field of Classification Search .................. 216/67; 438/689, 706, 715, 710; 427/255.27, 255.28
See application file for complete search history.

(56) References Cited

U.S. PATENT DOCUMENTS

| 5,328,558 | A | * | 7/1994 | Kawamura | .................. 438/707 |
| 2004/0029384 | A1 | | 2/2004 | Sakamoto et al. | |
| 2004/0041179 | A1 | | 3/2004 | Mizushima et al. | |
| 2004/0256645 | A1 | | 12/2004 | Tsuchiaki et al. | |

FOREIGN PATENT DOCUMENTS

| JP | 5-136087 A | 6/1993 |
| JP | 6-318563 A | 11/1994 |
| JP | 7-94446 A | 4/1995 |

(Continued)

*Primary Examiner*—Roberts Culbert
(74) *Attorney, Agent, or Firm*—Birch, Stewart, Kolasch & Birch, LLP

(57) ABSTRACT

A process for producing a silicon compound can minimize the number of steps and can form a desired compound in a low-temperature environment. The process comprises: allowing a radical of a halogen gas to act on a member 11 to be etched, which is disposed within a chamber 1 and is formed of a material containing an element capable of forming a compound with Si, while keeping the member 11 at a relatively high temperature, to form a gas of a precursor 24, which is a compound of the material and the halogen; holding a substrate 3 accommodated within the chamber 1 at a relatively low temperature, with the Si interface of the substrate 3 being exposed, to adsorb the precursor 24 onto the Si interface of the substrate 3; and then allowing the radical of the halogen gas to act on the precursor 24 adsorbed onto the Si interface to reduce the precursor 24, thereby producing a compound of the material and Si.

8 Claims, 2 Drawing Sheets

FOREIGN PATENT DOCUMENTS

| | | |
|---|---|---|
| JP | 9-59013 A | 3/1997 |
| JP | 2001-24194 A | 1/2001 |
| JP | 2001-64099 A | 3/2001 |
| JP | 2003-328128 A | 11/2003 |
| JP | 2004-83943 A | 3/2004 |
| JP | 2004-165627 A | 6/2004 |
| JP | 2004-327928 A | 11/2004 |
| JP | 2005-15832 A | 1/2005 |
| JP | 2005-19705 A | 1/2005 |

* cited by examiner

PROCESS FOR PRODUCING SILICON COMPOUND

TECHNICAL FIELD

This invention relates to a process for producing a silicon compound, more particularly, that useful when applied in forming a metal silicide for use, for example, in an electrode of an MOS transistor.

BACKGROUND ART

FIG. 4 is an explanation drawing showing an MOS transistor conceptually. As shown in this drawing, the MOS transistor has two p-regions formed on an n-type silicon substrate 04, a source electrode 01 and a drain electrode 02 formed in the respective p-regions, and a gate electrode 03 formed on the n-type silicon substrate 04 via a gate insulating film 05 which is a $SiO_2$ film. Such an MOS transistor having a NiSi film formed as the source electrode 01, the drain electrode 02 or the gate electrode 03 is produced.

In this case, heat treatment at 450° C. is necessary for silicidization of Ni. However, Ni which has been deposited for the formation of NiSi, or an impurity with which a semiconductor has been doped, may be diffused to cause defects in device manufacturing, or deterioration of characteristics.

To solve such problems, the following complicated process has been proposed: First, heat treatment at 400° C. is performed to form a mixture of a nickel-rich silicide, such as $Ni_2Si$, and Si at the desired site (gate electrode portion). Surplus Ni is removed by wet etching, and then heat treatment at 450° C. is performed to form complete NiSi.

Such a process involves the problems that the number of steps is large, and the treating temperature is still high. The higher the treating temperature, the more likely it is that problems will occur, such as the degradation of performance of the MOS transistor due to the diffusion of the doped impurity or the deterioration of insulation in the gate insulating film 05.

The following are present as documents disclosing the above-described conventional technologies:

Patent Document 1: Japanese Unexamined Patent Publication No. 2005-019705
Patent Document 2: Japanese Unexamined Patent Publication No. 2004-165627
Patent Document 3: Japanese Unexamined Patent Publication No. 1997-059013

DISCLOSURE OF THE INVENTION

Problems to be Solved by the Invention

The present invention has been accomplished in the light of the above-described conventional technologies. It is an object of the invention to provide a process for producing a silicon compound which can minimize the number of steps and can form a desired compound in a low-temperature environment.

Means for Solving the Problems

A first aspect of the present invention, for solving the above problems, is a process for producing a silicon compound, comprising:

allowing a radical of a halogen gas to act on a member to be etched, which is disposed within a chamber as a vacuum vessel and is formed of a material containing an element capable of forming a compound with Si, while keeping the member at a relatively high temperature, to form a gas of a precursor, which is a compound of the above material and the halogen;

holding a substrate accommodated within the chamber at a relatively low temperature, with a Si interface of the substrate being exposed, to adsorb the precursor onto the Si interface of the substrate; and then allowing the radical of the halogen gas to act on the precursor adsorbed onto the Si interface to reduce the precursor, thereby producing a compound of the above material and Si.

A second aspect of the present invention is the first aspect, characterized in that the member to be etched is Ni, and
NiSi is produced at the Si interface.

A third aspect of the present invention is the first aspect, characterized in that the member to be etched is Ni, and
an incubation time, which is a difference between times of production of a Ni compound of the precursor in a $SiO_2$ region and a Si region, is utilized to produce NiSi only at the interface of the Si region of the substrate having a surface where the $SiO_2$ region and the Si region are exposed and coexistent.

A fourth aspect of the present invention is any one of the first to third aspects, characterized in that an electrode of an MOS transistor is formed from NiSi produced at the silicon interface.

A fifth aspect of the present invention is the first aspect, characterized in that the member to be etched is graphite, and
an electrode of an MOS transistor is formed from SiC produced at the silicon interface.

A sixth aspect of the present invention is the first aspect, characterized in that the member to be etched is Fe, and
a p-type layer or an n-type layer of a solar cell is formed from FeSi produced at the Si interface.

Effects of the Invention

According to the present invention, a desired silicon compound is produced by a specific CVD apparatus which utilizes the etching reaction of the member to be etched, the adsorption reaction of the precursor formed by the etching reaction, and the reduction reaction of the adsorbed precursor. Thus, the silicon compound can be produced at a low temperature. Consequently, if a gate film or the like of a transistor is to be produced, in particular, a thin film of the desired silicon compound can be produced, with its characteristics free from deterioration. If a Si interface and $SiO_2$ are coexistent, in particular, NiSi can be selectively grown at the Si interface. Thus, a source electrode and a drain electrode of an MOS transistor can be easily and efficiently formed.

Furthermore, unlike the conventional technologies, there is no need for a separate step, such as removal of the unnecessary portion, after heat treatment is completed. Accordingly, the production of the compound concerned can be performed efficiently.

DESCRIPTION OF THE REFERENCE NUMERALS

1 Chamber
3 Substrate
8 Plasma antenna
11 Member to be etched
21 Acting source

BEST MODE FOR CARRYING OUT THE INVENTION

An embodiment of the present invention will now be described in detail based on the accompanying drawings. The description of this embodiment is illustrative, and the features of the present invention are not limited to the following description.

Figure 1:
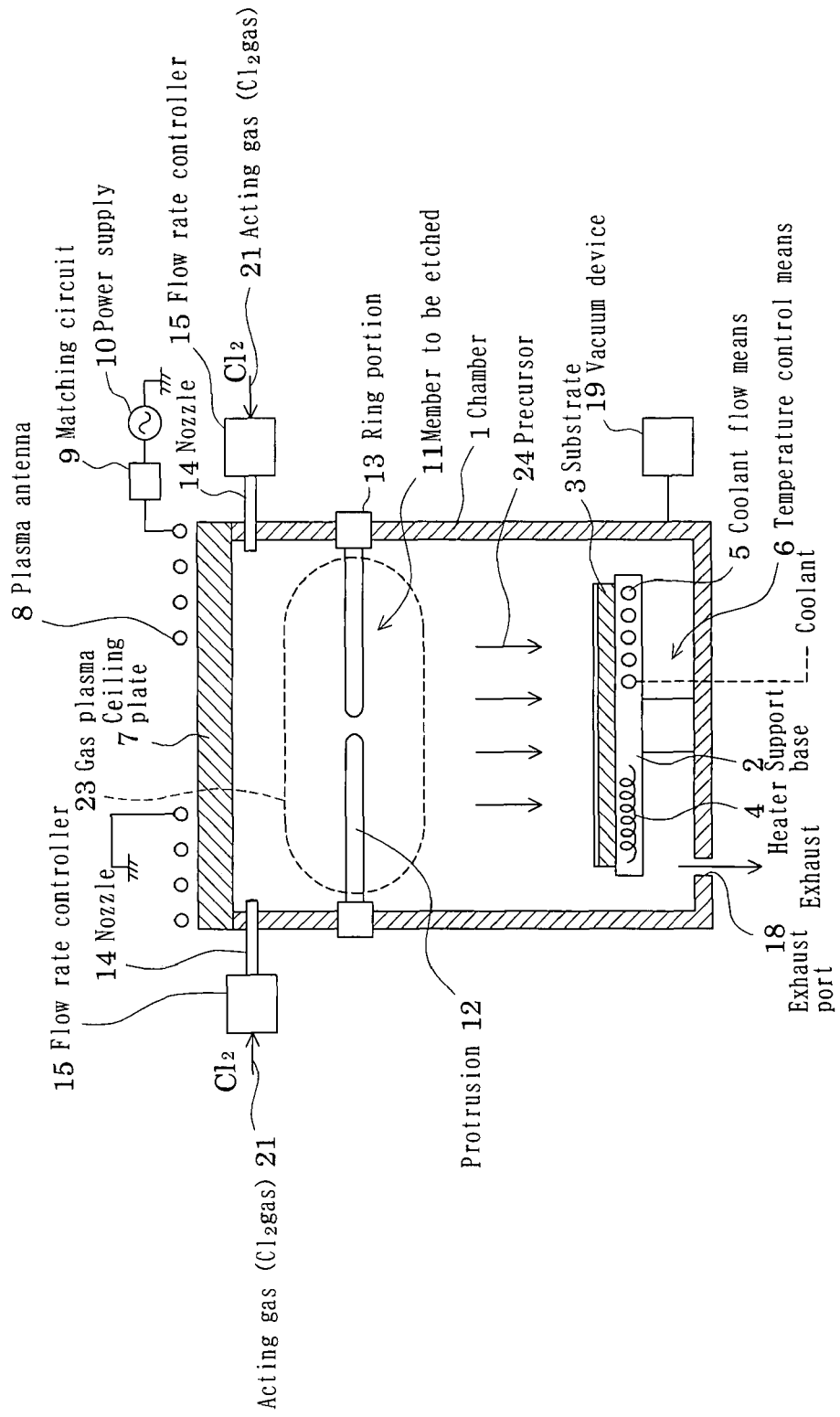
FIG. 1 is a front view schematically showing an apparatus for use in a process for producing a silicon compound according to an embodiment of the present invention.

FIG. 1 is a front view showing schematically an apparatus which realizes the process for producing a silicon compound according to the embodiment of the present invention. Prior to an explanation for the process according to the present embodiment, the apparatus will be described.

As shown in FIG. 1, a support base 2 is provided in the vicinity of the bottom of a chamber 1 formed in a cylindrical shape and made of, for example, a ceramic (made of an insulating material). A substrate 3 is placed on the support base 2. An interface of Si is exposed at the upper surface of the substrate 3.

A temperature control means 6 equipped with a heater 4 and a coolant flow means 5 is provided in the support base 2. The support base 2 is controlled to a predetermined temperature (for example, a temperature at which the substrate 3 is maintained at 100 to 300° C.) by the temperature control means 6.

The upper surface of the chamber 1 is an opening portion, and the opening portion is closed with a ceiling plate 7 which is a plate of an insulating material (for example, a ceramic). A plasma antenna 8 for plasmatizing the interior of the chamber 1 is provided above the ceiling plate 7, and the plasma antenna 8 is formed in the shape of a flat ring parallel to the plane of the ceiling plate 7. A matching circuit 9 and a power supply 10 are connected to the plasma antenna 8 to supply a high frequency current. The plasma antenna 8, the matching circuit 9, and the power supply 10 constitute a plasma generation means for generating an inductive plasma.

A member 11 to be etched, which is formed of a material containing an element capable of forming a compound with Si, is held in the chamber 1. The member 11 to be etched is disposed in a discontinuous state, with respect to the flow of electricity of the plasma antenna 8, between the substrate 3 and the ceiling plate 7. For example, the member 11 to be etched comprises rod-shaped protrusions 12 and a ring portion 13. The ring portion 13 is provided such that the protrusions 12 extend toward the center of the chamber 1. Because of this configuration, the member 11 to be etched is in a structurally discontinuous state with respect to a circumferential direction which is the direction of flow of electricity of the plasma antenna 8.

A mode in which the member to be etched is formed like a lattice or like a network is conceivable as a configuration in which the member to be etched is brought into a discontinuous state with respect to the flow of electricity of the plasma antenna 8.

A plurality of nozzles 14 for supplying an acting gas ($Cl_2$ gas) 21 containing Cl as a halogen to the interior of the chamber 1 are connected (for example, at eight locations; two locations are shown in the drawing), with equal spacing in the circumferential direction, to the periphery of the tubular portion of the chamber 1 above the member 11 to be etched. Each of the nozzles 14 is fed with the $Cl_2$ gas 21 via a flow rate controller 15 which controls the flow rate and pressure. The flow rate controller 15 controls the amount of the $Cl_2$ gas 21 supplied into the chamber 1, thereby controlling a gas plasma density within the chamber 1.

Substances, such as a gas which does not take part in the reaction, are discharged through an exhaust port 18. The interior of the chamber 1 sealed by the ceiling plate 7 is maintained at a predetermined degree of vacuum by evacuation using a vacuum device 19.

Fluorine, bromine and iodine can be applied as a halogen contained in the acting gas. In the present embodiment, an inexpensive $Cl_2$ gas is used as the halogen, whereby the running cost can be reduced.

To form a silicon compound on the substrate 3 with the use of such an apparatus, the $Cl_2$ gas 21 is supplied to the interior of the chamber 1 through the nozzles 14, and a high frequency electromagnetic wave is thrown by the plasma antenna 8 into the chamber 1. By so doing, the $Cl_2$ gas 21 is ionized to generate a $Cl_2$ gas plasma 23, generating Cl radicals.

Here, the gas plasma 23 acts on the member 11 to be etched, thereby heating the member 11 to be etched, and causing an etching reaction to the member 11 to be etched. Upon this etching reaction, a gaseous precursor 24 is formed which is a compound of the material for the member 11 to be etched and Cl.

The precursor 24 is adsorbed onto the surface of the substrate 3 which is at a lower temperature than the temperature of the member 11 to be etched. Cl radicals act on the adsorbed precursor 24 to reduce it. As a result, a compound of Si with the material for the member 11 to be etched is produced on the substrate 3.

Figure 2:
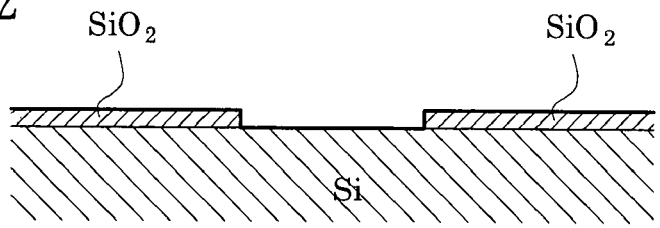
FIG. 2 is an explanation drawing showing the coexistence of a Si interface and a $SiO_2$ surface conceptually.
Figure 3:
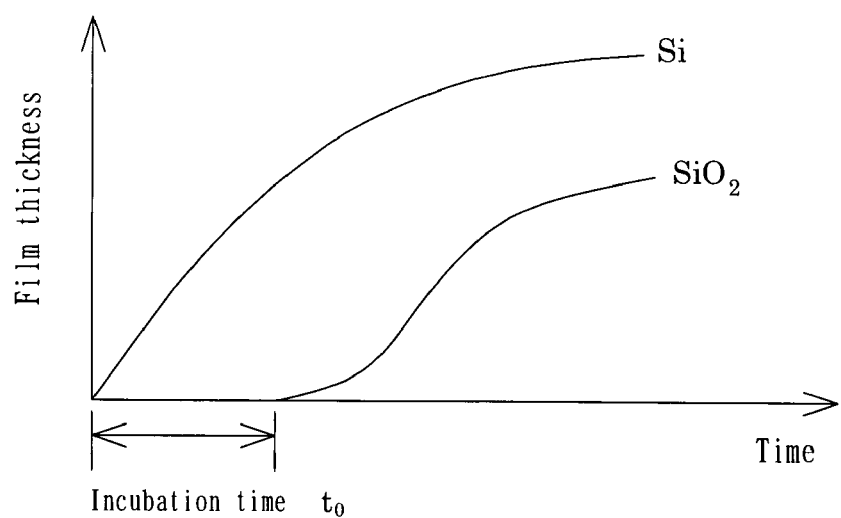
FIG. 3 is a graph showing the formation characteristics of a Ni film at the Si interface and the $SiO_2$ surface.

If the member 11 to be etched is formed of Ni, NiSi can be produced on the substrate 3. If, during production of NiSi, a $SiO_2$ film and a Si interface are coexistent on the surface of the substrate 3, as shown in FIG. 2, a NiSi film is selectively formed at the Si interface. This is because the rate of formation of the NiSi film greatly differs, depending on whether the NiSi film is formed on Si or it is formed on $SiO_2$. That is, as shown in FIG. 3, film formation on $SiO_2$ starts only after a lapse of a predetermined incubation time $t_0$, and the rate of film formation on $SiO_2$ is low after start of film formation.

If the incubation time $t_0$ is utilized, and if it is attempted to complete film formation during this incubation time $t_0$, NiSi can be formed selectively only at the Si interface. Even if the Ni film is formed on $SiO_2$, the amount of its formation is very small compared with that of the NiSi film. Thus, the Ni film on $SiO_2$ can be removed easily.

In the substrate 3 where the Si interface and the $SiO_2$ surface are coexistent, as noted above, selective growth of the NiSi film at the Si interface can be achieved. This is a major characteristic of the present invention.

According to the above-described embodiment, the desired silicon compound can be produced on the substrate 3 by selecting, as appropriate, the material for the member 11 to be etched. Thus, some methods for producing concrete silicon compounds will be described as working examples.

FIRST EXAMPLE

Figure 4:
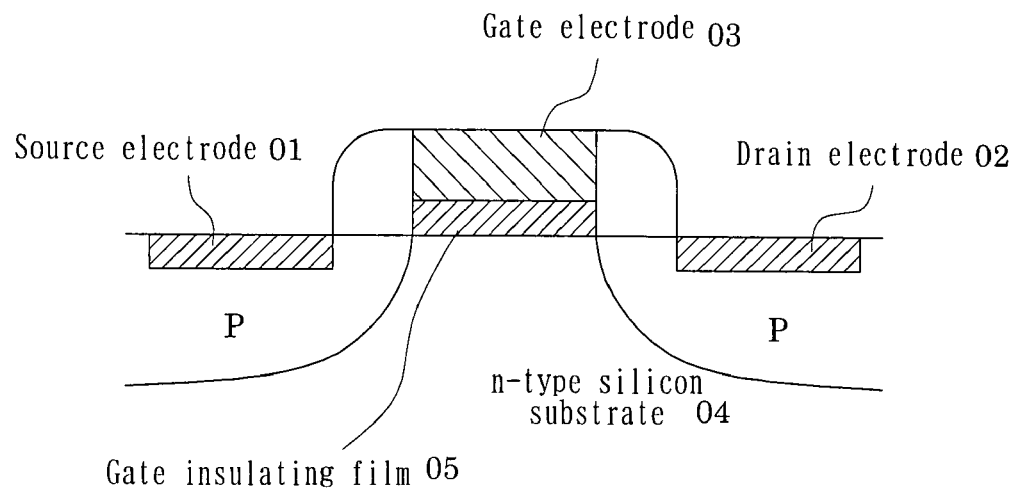
FIG. 4 is an explanation drawing showing an MOS transistor conceptually.

This example is an example in which NiSi is produced as the source electrode 01 and the drain electrode 02 of the MOS transistor shown in FIG. 4. The substrate 3 in this case is in a state in which a SiO$_2$ film is formed on a Si substrate, and the SiO$_2$ film at sites where the source electrode 01 and the drain electrode 02 are to be formed is removed, with the Si interface being exposed at these sites. The substrate 3 of such a configuration is placed on the support base 2 within the chamber 1 of the apparatus shown in FIG. 1. At this time, the member 11 to be etched is formed of Ni.

Using such an apparatus, the Cl$_2$ gas 21 is supplied to the interior of the chamber 1 through the nozzles 14, and a high frequency electromagnetic wave is thrown by the plasma antenna 8 into the chamber 1. By so doing, the Cl$_2$ gas 21 is ionized to generate the Cl$_2$ gas plasma 23 and generate Cl radicals. As a result, the following reactions are caused within the chamber 1, whereby the source electrode 01 and the drain electrode 02 each comprising the NiSi film at the Si interface can be formed.

(1) Etching Reaction

By the action of Cl* radicals, the following etching reaction of the member 11 to be etched proceeds:

$$Ni(s)+Cl^* \rightarrow NiCl\ (g) \quad (1)$$

The above formula (1) shows a state in which Ni is etched with the gas plasma 23 (chlorine radicals Cl*) to form the precursor (NiCl) 24.

As noted above, the gas plasma 23 is generated to heat the member 11 to be etched (for example, at 300° C. to 700° C.), while the temperature of the substrate 3 is kept at a temperature lower than the temperature of the member 11 to be etched (for example, at a temperature of 100° C. to 300° C.) by the temperature control means 6.

(2) Adsorption (Deposition) Reaction

Under the above temperature conditions, the following adsorption reaction of the precursor 24 proceeds:

$$NiCl\ (g) \rightarrow NiCl\ (ad) \quad (2)$$

(3) Reduction Reaction

NiSi is produced by the following reducing action of chlorine radicals Cl*:

$$NiCl\ (ad)+Cl^* \rightarrow NiSi\ (s)+Cl_2\uparrow \quad (3)$$

In the above formulas (1) to (3), the symbol denotes a solid state, g denotes a gaseous state, and ad denotes an adsorbed state.

SECOND EXAMPLE

This example is an example in which the gate electrode 03 of the MOS transistor shown in FIG. 4 is formed. The substrate 3 in this case is in a state in which a Si interface, such as polysilicon for formation of the gate electrode 03, is exposed. This substrate 3 is placed on the support base 2 within the chamber 1 of the apparatus shown in FIG. 1. At this time, the member 11 to be etched is formed of Ni.

Using such an apparatus, the Cl$_2$ gas 21 is supplied to the interior of the chamber 1 through the nozzles 14, and a high frequency electromagnetic wave is thrown by the plasma antenna 8 into the chamber 1. By so doing, the Cl$_2$ gas 21 is ionized to generate the Cl$_2$ gas plasma 23 and generate Cl radicals. As a result, the following reactions are caused within the chamber 1, whereby the gate electrode 03 comprising a NiSi film at the Si interface can be formed.

THIRD EXAMPLE

This example is an example in which the gate stack of the MOS transistor shown in FIG. 4 is formed. The SiO$_2$ film which is the gate insulating film 05 is formed on the n-type silicon substrate 04 as the substrate 3 in this case. A Ni film is formed on the gate insulating film 05 by the same method as in the above examples. By this measure, a part of the Si component of SiO$_2$ reacts with Ni to form a NiSi film as the gate electrode 03.

FOURTH EXAMPLE

All the electrodes 01, 02 and 03 of the MOS transistor can be formed by combining the first and second examples mentioned above.

FIFTH EXAMPLE

Similarly, all the electrodes 01, 02 and 03 of the MOS transistor can be formed, and the entire gate structure including SiO$_2$, which is the gate insulating film 05, can be formed, by combining the first and third examples mentioned above.

SIXTH EXAMPLE

Among substances expected as materials for a solar cell is FeSi. To prepare a solar cell by use of FeSi, it is necessary to form a p-type silicon layer and an n-type silicon layer of the solar cell from FeSi. In this case as well, the present invention can be applied, and shows excellent effects. Concretely, it is recommendable that the member 11 to be etched, which is shown in FIG. 1, be formed of Fe, and an Fe film be formed on a p-type silicon layer or an n-type silicon layer of the substrate 3. By so doing, Fe and Si react to form p-type and n-type FeSi layers, whereby the p-type layer and n-type layer of the solar cell can be formed.

In forming the n-type silicon layer and the p-type silicon layer, the apparatus shown in FIG. 1 can be utilized. For example, it is advisable that the member 11 to be etched be formed of Si, and a p-type Si layer and an n-type Si layer be formed, with B being incorporated into a halogen gas as the acting gas, in the case of the p-type, or with p being incorporated into the halogen gas, in the case of the n-type.

On this occasion, the member 11 to be etched, which is formed of Si, can be omitted by incorporating Si into the acting gas.

OTHER EXAMPLES

Recently, it has been found that the mobility of an nMOS transistor can be increased by using SiC, instead of the conventional SiGe, as the source electrode 01 and the drain electrode 02 of the MOS transistor, thereby introducing tensile strain into the channel. In forming SiC in this case, the application of the present invention obtains the aforementioned excellent effects. Concretely, it suffices to form the member 11 to be etched, shown in FIG. 1, from graphite, and perform the same steps as in the first example.

In the apparatus shown in FIG. 1, the halogen gas is plasmatized within the chamber 1 to form its radicals. However, the method of radical formation need not be limited thereto. For example, the radicals can be formed by any of the following methods:

1) A high frequency electric field is allowed to act on a halogen gas flowing through a tubular passage communicating with the chamber 1, to plasmatize the halogen gas.

2) A microwave is supplied to a halogen gas flowing through a tubular passage communicating with the chamber 1, to plasmatize the halogen gas.

3) A halogen gas flowing through a tubular passage communicating with the chamber 1 is heated for thermal dissociation.

4) An electromagnetic wave or an electron beam is supplied to a halogen gas flowing through a tubular passage communicating with the chamber 1, to dissociate the halogen gas.

5) A halogen gas flowing through a tubular passage communicating with the chamber 1 is brought into contact with a catalytic metal which dissociates the halogen gas by a catalytic action.

The invention claimed is:

1. A process for producing a silicon compound, comprising:
   allowing a radical of a halogen gas to act on a member to be etched, which is disposed within a chamber as a vacuum vessel and is formed of a material containing an element capable of forming a compound with Si, while keeping the member at a relatively high temperature, to form a gas of a precursor, which is a compound of the material and the halogen;
   holding a substrate accommodated within the chamber at a relatively low temperature, with a Si interface of the substrate being exposed, to adsorb the precursor onto the Si interface of the substrate; and
   then allowing the radical of the halogen gas to act on the precursor adsorbed onto the Si interface to reduce the precursor, thereby producing a compound of the material and Si.

2. The process for producing a silicon compound according to claim 1, wherein
   the member to be etched is Ni, and
   NiSi is produced at the Si interface.

3. The process for producing a silicon compound according to claim 1, wherein
   the member to be etched is Ni, and
   an incubation time, which is a difference between times of production of a Ni compound of the precursor in a $SiO_2$ region and a Si region, is utilized to produce NiSi only at the interface of the Si region of the substrate having a surface where the $SiO_2$ region and the Si region are exposed and coexistent.

4. The process for producing a silicon compound according to claim 1, wherein
   an electrode of an MOS transistor is formed from NiSi produced at the silicon interface.

5. The process for producing a silicon compound according to claim 2, wherein
   an electrode of an MOS transistor is formed from NiSi produced at the silicon interface.

6. The process for producing a silicon compound according to claim 3, wherein
   an electrode of an MOS transistor is formed from NiSi produced at the silicon interface.

7. The process for producing a silicon compound according to claim 1, wherein
   the member to be etched is graphite, and
   an electrode of an MOS transistor is formed from SiC produced at the silicon interface.

8. The process for producing a silicon compound according to claim 1, wherein
   the member to be etched is Fe, and
   a p-type layer or an n-type layer of a solar cell is formed from FeSi produced at the Si interface.

* * * * *